United States Patent
Bakhmutsky

[11] Patent Number: 5,808,570
[45] Date of Patent: Sep. 15, 1998

[54] DEVICE AND METHOD FOR PAIR-MATCH HUFFMAN TRANSCODING AND HIGH-PERFORMANCE VARIABLE LENGTH DECODER WITH TWO-WORD BIT STREAM SEGMENTATION WHICH UTILIZES THE SAME

[75] Inventor: Michael Bakhmutsky, Briarcliff Manor, N.Y.

[73] Assignee: Philips Electronics North America Corp., NY, N.Y.

[21] Appl. No.: 749,039

[22] Filed: Nov. 14, 1996

Related U.S. Application Data

[63] Continuation-in-part of Ser. No. 672,246, Jun. 28, 1996, abandoned.

[51] Int. Cl.⁶ ................................................. H03M 7/40
[52] U.S. Cl. ........................ 341/65; 341/67; 341/106; 341/107
[58] Field of Search .......................... 341/65, 67, 61, 341/106, 107

[56] References Cited

U.S. PATENT DOCUMENTS

| | | | |
|---|---|---|---|
| 5,173,695 | 12/1992 | Sun et al. .................................. | 341/67 |
| 5,181,031 | 1/1993 | Tong et al. ................................. | 341/65 |
| 5,268,769 | 12/1993 | Tsuchiya et al. ........................ | 358/427 |
| 5,491,480 | 2/1996 | Jan et al. .................................. | 341/67 |
| 5,648,774 | 6/1997 | Hsieh ........................................ | 341/67 |
| 5,650,905 | 7/1997 | Bakhmutsky ............................. | 341/67 |
| 5,668,548 | 9/1997 | Bakhmutsky . | |
| 5,675,332 | 10/1997 | Limberg .................................. | 341/67 |
| 5,677,690 | 10/1997 | Sohn ....................................... | 341/67 |
| 5,686,915 | 11/1997 | Nelson et al. ............................ | 341/65 |

OTHER PUBLICATIONS

PHA 23,135, U.S. Patent Application Serial No. 08/672,246, Filed Jun. 28, 1996.

*Primary Examiner*—Jeffrey A. Gaffin
*Assistant Examiner*—Jason L. W. Kost
*Attorney, Agent, or Firm*—Laurie E. Gathman

[57] ABSTRACT

A method for pair-match Huffman transcoding a Huffman-encoded bit stream (e.g., an MPEG digital video bit stream) which includes a plurality of qualifying and non-qualifying types of variable length original code words to be processed by a variable length decoder (VLD) with two-word bit stream segmentation, wherein the VLD has a decoding window N bits wide. The method includes the steps of pair-match Huffman transcoding at least selected ones of the qualifying types of code words to produce corresponding transcoded code words in such a manner that the combined length of any pair of the transcoded code words is ≦N. A device for implementing this method, as well as a high-performance variable length decoder with two-word bit stream segmentation which utilizes this method, are also disclosed.

56 Claims, 9 Drawing Sheets

TABLE 1.

| OLD SYMBOL | TRANSCODED SYMBOL | MEANING | MAPPING RATIO | BUFFER SIZE UP (+) DOWN (−) |
|---|---|---|---|---|
| 11s → | 110s | RUN 0, LEVEL 1 | 4/3 | +33.33% |
|  | 111 [+12] | ESCAPE SEQUENCE, RUN 0. | 15/24 | −37.50% |
| 011s → | 0110s | RUN 1, LEVEL 1 | 5/4 | +25.00% |
|  | 0111 [+12] | ESCAPE SEQUENCE, RUN 1. | 16/24 | −33.33% |
| 0100s → | 01000s | RUN 0, LEVEL 2 | 6/5 | +20.00% |
|  | 01001 [+8] | DCT COEFFICIENTS, LENGTH 11+ | 13/17 TO 13/11 | −23.50% TO +18.20% |

NO MORE CHANGES FOR DCT COEFFICIENT TABLE 0.

MAX. RATE BUFFER SIZE INCREASE          33.33%.

NO. OF OLD WORD LENGTHS                 14.
NO. OF OLD PREFIX COMBINATIONS ($14^2$)  196.

NO. OF TRANSCODED WORD LENGTHS          8.
NO. OF TRANSCODED PREFIX COMBINATIONS ($8^2$)  64.

REDUCTION IN TABLE SIZE (196/64)        3.06 TIMES.

FIG. 8

TABLE 2.

| OLD SYMBOL | TRANSCODED SYMBOL | MEANING | MAPPING RATIO | BUFFER SIZE UP (+) DOWN (−) |
|---|---|---|---|---|
| 0110s → | 01100s<br>01101 [+8] | END OF BLOCK<br>DCT COEFFICIENTS, LENGTH 11+ | 5/4<br>13/17 TO<br>13/11 | +25.00%<br>−23.50% TO<br>+18.20% |
| 010s → | 0100s<br>0101 [+12] | RUN 1, LEVEL 1<br>ESCAPE SEQUENCE, RUN 0. | 5/4<br>16/24 | +25.00%<br>−33.33% |
| 110s → | 1100s<br>1101 [+12] | RUN 0, LEVEL 2<br>ESCAPE SEQUENCE, RUN 1. | 5/4<br>16/24 | +25.00%<br>−33.33% |

NO MORE CHANGES FOR DCT COEFFICIENT TABLE 1.

| | |
|---|---|
| MAX. RATE BUFFER SIZE INCREASE | 25%. |
| NO. OF OLD WORD LENGTHS | 14. |
| NO. OF OLD PREFIX COMBINATIONS ($14^2$) | 196. |
| NO. OF TRANSCODED WORD LENGTHS | 8. |
| NO. OF TRANSCODED PREFIX COMBINATIONS ($8^2$) | 64. |
| REDUCTION IN TABLE SIZE (196/64) | 3.06 TIMES. |

FIG. 9

DEVICE AND METHOD FOR PAIR-MATCH HUFFMAN TRANSCODING AND HIGH-PERFORMANCE VARIABLE LENGTH DECODER WITH TWO-WORD BIT STREAM SEGMENTATION WHICH UTILIZES THE SAME

RELATED APPLICATION

This application is a continuation-in-part of prior application Ser. No. 08/672,246, filed Jun. 28, 1996, for an invention entitled "High Performance Variable Length Decoder with Two-Word Bit Stream Segmentation and Related Method" now abandoned. The inventor and assignee are the same for both this application and the above-identified prior application.

BACKGROUND OF THE INVENTION

The present invention relates generally to variable length decoders used in data transmission systems, and more particularly, to a high-performance variable length decoder with two-word bit stream segmentation (and related method) for decoding digital video data for high definition television (HDTV) which employs pair-match Huffman transcoding in order to enable an economical implementation of the decoder without any statistical trade-offs.

In digital video data transmission systems, video data is encoded prior to being transmitted to a receiver, which decodes the encoded digital video data. The decoded digital video data is then output to a subsequent signal processing stage. To increase the data throughput and memory efficiency of such systems, statistical compression algorithms are used to compress and encode the digital video data. One such compression algorithm is the Huffman coding algorithm. Compressing the data typically results in data streams segmented into variable length code words rather than fixed length code words. Variable length decoders decode the variable length code words comprising the compressed data stream.

There are several presently available methods for decoding a sequence of variable length code words. The most prevalent methods are the tree searching algorithm and the table look-up technique.

The tree searching algorithm uses a bit-by-bit search through a code tree to find the end and value of each code word in the input bit stream. The coding tree includes leaves of known code words. The decoding process begins at the root of the coding tree and continues bit-by-bit to different branches of the coding tree, depending upon the decoded value of each successive bit in the bit stream. Eventually a leaf is reached and the end of the code word is detected. The code word is then segmented from the rest of the bit stream and the value of the detected code word is looked up and output from the variable length decoder. Decoding a bit stream using the tree searching algorithm is too slow for many high speed applications, since the decoding operation is performed at the bit rate rather than at the symbol rate. In this connection, decoding a bit stream at the bit rate does not satisfy the peak symbol rate requirements of an HDTV decoder.

To increase the data throughput of a variable length decoder a table look-up decoder was developed, such as the one disclosed in U.S. Pat. No. 5,173,695, issued to Sun et al., the disclosure of which is herein incorporated by reference. The input of the table look-up decoder disclosed in the above-referenced patent is connected to the output of a rate buffer which receives a variable-word-length encoded bit stream at its input and outputs in parallel sequences of bits equal in length to the maximum length code word in the bit stream. These sequences are read into cascaded latches. The cascaded sequences in both latches are input to a barrel shifter which provides from its multi-bit input, a sliding decoding window to a table-lookup decoder. A control signal directly shifts the position of the decoding window of the barrel shifter as each code word is detected.

To detect each code word, the initial bits in the decoding window are compared with code word entries in the table-lookup decoder. When a code word is detected, the corresponding code word length is added to the value of an accumulator with previously accumulated code word lengths to produce the control signal which directly shifts the decoding window by the number of bits in the just decoded word. When all of the bits in the first latch have been decoded, the next bit sequence in the buffer is input to the second latch while the previous bit sequence in the second latch is transferred to the first latch. The decoding window is then shifted to the beginning of the next code word in the undecoded sequence. The shifting of the decoding window and the decoding of the code word can be done in one clock cycle. As a result, the table look-up decoder is capable of decoding one code word per clock cycle regardless of its bit length, thereby dramatically increasing the data throughput of the decoder relative to the previously available tree searching algorithm decoder.

In consumer HDTV applications, however, where the peak symbol rate is about 100 million code words per second, decoding the whole picture at the symbol rate with a single variable length decoder becomes impractical. In HDTV systems the variable length decoder (VLD) is used to extract an entire picture from a rate buffer within the picture display time. The VLD must decode words in the data stream at the peak symbol rate (PSR), which depends upon the display resolution and the display time. For HDTV systems which use the MPEG ("Moving Pictures Expert Group") protocol a VLD throughput of 100 million or more code words per second is required.

In addition to the technical problems associated with implementing the VLD itself with such throughput, the high-speed VLD interface with the large capacity rate buffer is quite expensive with the currently available memory technology. The problem becomes more severe if price is an issue, since faster and more expensive memory devices such as static random access memories (SRAMs) and synchronous dynamic random access memories (SDRAMs) must be used, rather than slower and cheaper memory devices such as asynchronous DRAMs. Of course, the price of the memory is a particularly important consideration for a consumer product, such as an HDTV set.

In current implementations, HDTV systems are normally partitioned into multiple processing paths, using multiple VLDs to decode different portions of the picture in parallel. In such implementations, the VLD is one of the major bottlenecks. Because each partition of the picture may contain almost all of the picture information, multiple dedicated ping-pong buffers are required between all of the VLDs and the rate buffer, thereby dramatically increasing the amount of bit stream memory required for the system. For example, a partitioned decoding system having eight parallel VLDs may require eight ping-pong buffers, each one of the ping-pong buffers being twice the size of the rate buffer, thereby increasing the amount of required buffer memory by a factor of sixteen over a system having a single VLD.

In HDTV systems, the input bit stream is normally an MPEG digital video data stream which includes payload data and setup data. The payload data, which constitutes the overwhelming majority of the data (about 95% of the data), is represented by contiguous code words such as DCT (discrete cosine transform) coefficients and motion vectors, which are decoded using their respective look-up tables. The setup data, which constitutes the remaining portion of the data (about 5% of the data), is represented by singular code words which are decoded using different look-up tables.

Based on the above and foregoing, it can be appreciated that there presently exists a need in the art for a variable length decoder which overcomes the above-discussed drawbacks and shortcomings of the presently available technology, and which can be used to implement a single VLD HDTV decoder, rather than a partitioned HDTV decoder. More particularly, there presently exists a need in the art for a variable length decoder having a data throughput which is adequate for processing digital video data, but at a lower clock rate, thereby enabling the use of cheaper (slower) memory and making more practical the implementation of the variable length decoder.

To fulfill this need in the art, and increase the data throughput, a variable length decoder capable of pre-tagging the input bit stream and of parallel processing contiguous code words of identical type was developed and disclosed in a co-pending U.S. patent application entitled "HIGH PERFORMANCE VARIABLE LENGTH DECODER WITH ENHANCED THROUGHPUT DUE TO TAGGING OF THE INPUT BIT STREAM AND PARALLEL PROCESSING OF CONTIGUOUS CODE WORDS," by M. Bakhmutsky (the present inventor), U.S. Pat. No. 5,668,548, which issued on Sept. 16, 1997, the teachings of which are herein incorporated by reference. Although the variable length decoder disclosed in the above-referenced application constitutes an excellent solution for both higher throughput and lower clock rate, the overhead of both the tree-searching pre-tagging circuit and the additional buffer memory of the same size as the rate buffer result in a product cost which may be prohibitive for at least some consumer HDTV decoders. Thus, the cost of this variable length decoder constitutes a shortcoming thereof.

Accordingly, a high performance variable length decoder meeting these stringent requirements for a consumer HDTV decoder was developed and disclosed in a co-pending U.S. patent application entitled "VARIABLE LENGTH DECODER WITH ADAPTIVE ACCELERATION IN PROCESSING OF HUFFMAN ENCODED BIT STREAMS", by M. Bakhmutsky (the present inventor), U.S. Pat. No. 5,650,905, which issued on Jul. 22, 1997, the teachings of which are herein incorporated by reference. The throughput per clock cycle of the variable length decoder disclosed in this application is adaptively increased for a selected group of code words in the Huffman encoded input bit stream which have a bit length less than a prescribed number, by decoding combinations of two or more code words from the selected group, during a single clock cycle, using a combination value look-up table. Since the code words in the selected group are the statistically most frequently occuring code words in the Huffman encoded input bit stream, the variable length decoder is able to process an entire picture at a reduced clock rate, without sacrificing throughput. Thus, improved statistical performance is attained due to adaptive acceleration in processing code words in the selected group. However, while this statistical performance enhancement mechanism guarantees a higher average minimum code word length for an entire picture, it does not guarantee that picture elements smaller than the size of the entire picture may be processed with higher throughput. The inability to guarantee high performance with regard to local activity constitutes a shortcoming of this variable length decoder, since it could impair real-time picture processing. Good handling of local activity is vital for real-time picture processing performed without unnecessary overhead in picture memory.

Hence, a need exists in the art for a variable length decoder which has performance comparable to that of the above-referenced high-speed variable length decoders, but which overcomes the shortcomings thereof.

The invention disclosed in the above-identified parent application fulfills this need in the art by providing a high-performance variable length decoder with two-word bit stream segmentation (and related method) which achieves high performance without the expense of high hardware complexity and additional memory. In particular, this VLD is capable of processing macroblocks in real-time at rates exceeding 100 million code words per second, thus satisfying the stringent requirements for use in contemporary digital HDTV video decoders, such as an MPEG-2 Main Profile, High Level compliant HDTV video decoder. Provided that the bit width of the decoding window is wide enough to accomodate two maximum-size code words, the qualifying code words are guaranteed to be processed with double throughput at approximately one-half of the clock rate required for the conventional single-path VLD disclosed in U.S. Pat. No. 5,173.695, issued to Sun et al. The maximum-size qualifying code word (AC coefficient) in the MPEG-2 protocol is 24 bits long. Therefore, providing a 48-bit-wide decoding window will guarantee double throughput for all qualifying code words.

However, in the actual hardware implementation of the high-performance VLD with two-word bit stream segmentation disclosed in the parent application, the 48-bit-wide decoding window is disadvantageous, because it results in a reduced speed of operation and a higher gate count in silicon, and thus, is less economical than is desirable for many consumer applications. Although it might be possible to find a VLD implementation which constitutes acceptable statistical trade-off amongst the width of the decoding window, the macroblock clock cycle allocation (VLD clock rate), and the acceptable frequency of VLD failures in those worst-case situations in which too many specific qualifying code word pairs are "broken", i.e., not parallel-processed or "pair-matched", due to their combined length exceeding the bit width of the decoding window, this VLD implementation would not be "failure-free" (i.e., immune to failures), and thus, would not meet the most stringent requirements of some contemporary digital HDTV video decoders.

Based on the above, it can be appreciated that there presently exists a need in the art for a high-performance VLD with two-word bit stream segmentation which has a decoding window having a bit-width less than double the length of the maximum-length qualifying code word, while at the same time guaranteeing both double throughput and failure-free peak code word throughput on the macroblock level. Such a high-performance VLD with two-word bit stream segmentation would provide a higher throughput, lower-cost, failure-free, "unbreakable" VLD architecture that would satisfy the most stringent requirements of the contemporary digital HDTV video decoders with minimal memory overhead. The present invention fulfills this need in the art.

SUMMARY OF THE INVENTION

The present invention encompasses, in one of its aspects, a method for pair-match Huffman transcoding a Huffman-encoded bit stream which includes a plurality of qualifying and non-qualifying types of variable length original code words to be processed by a variable length decoder (VLD) with two-word bit stream segmentation, wherein the VLD has a decoding window N bits wide, and N is less than the combined length of two maximum length qualifying code words. The method includes the steps of pair-match Huffman transcoding at least selected ones of the qualifying types of code words to produce corresponding transcoded code words in such a manner that the combined length of any pair of the transcoded code words is ≦N. Preferably, the Huffman-encoded bit stream is an MPEG video bit stream which includes payload data and setup data, the qualifying types of code words are code word types corresponding to the payload data, and the non-qualifying types of code words are code word types corresponding to the setup data.

In a presently contemplated application, the Huffman-encoded bit stream is an MPEG video bit stream which includes motion vectors, DCT coefficients (including DCT Huffman symbols and DCT coefficient escape sequences having runs of 0, 1, and 2 or more), and setup data, where the qualifying code words include the motion vectors and DCT coefficients. Preferably, all of the transcoded code words which represent original DCT coefficients having a bit length ≧11 have the same bit length.

In the preferred embodiment, the at least selected ones of the qualifying types of code words include all DCT coefficient escape sequences having runs of 0 and 1, and all DCT coefficients having a bit length ≧11. Further, the step of pair-match Huffman transcoding is preferably carried out by adding one bit to the end of each of a plurality of the original code words in order to thereby produce respective transcoded code words. For each of the transcoded code words, a first logic level of the added bit indicates that the transcoded code word has the same meaning as the respective original code word, and a second logic level of the added bit indicates that the transcoded code word has a different meaning from that of the respective original code word.

In the preferred embodiment, the combined length of any pair of the qualifying types of code words which are not transcoded is ≦N, except for qualifying types of code words which can be processed singularly in such a manner as to ensure that at least four DCT coefficients are processed during two sequential clock cycles. The qualifying types of code words which can be processed singularly in such a manner as to ensure that at least four DCT coefficients are processed during two sequential clock cycles preferably include the DCT coefficient escape sequences having runs of 2 or more.

The present invention, in another of its aspects, encompasses a device for implementing the Huffman transcoding method of the present invention, as well as a high-performance variable length decoder with two-word bit stream segmentation which utilizes this method.

BRIEF DESCRIPTION OF THE DRAWINGS

These and other objects, features, and advantages of the present invention will be readily understood from the following detailed description taken in conjunction with the accompanying drawings, in which:

FIG. 8 depicts a Table 1 which corresponds to the MPEG-2 DCT Coefficient Table 0, and which illustrates both the original ("old") symbols and the transcoded symbols which are obtained as a result of a particular implementation of the pair-match Huffman transcoding method of the present invention;

FIG. 9 depicts a Table 2 which corresponds to the MPEG-2 DCT Coefficient Table 1, and which illustrates both the original ("old") symbols and the transcoded symbols which are obtained as a result of a particular implementation of the pair-match Huffman transcoding method of the present invention; and, FIG. 10 is a diagrammatical illustration which compares the real-time processing of 1920×1088 HDTV pictures for different chroma formats, using the Huffman transcoding method of the present invention in conjunction with a VLD using a two-word bit stream segmentation, as opposed to the conventional VLD using single-word bit stream segmentation.

DETAILED DESCRIPTION OF THE INVENTION

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the present invention would be of significant utility.

In overview, the invention disclosed in the parent application (Ser. No. 08/672,246) relates to a high-performance, low-cost variable length decoder (VLD) which provides at least two-word rather than one-word bit stream segmentation for all or almost all code words of a qualifying type, e.g., all DCT coefficients and motion vectors (payload data—which constitutes approximately 95% of an MPEG-2 bit stream), in order to reduce the complexity and memory requirements of the VLD. More particularly, the prefixes of each pair (or other plural number M ≧2) of qualifying code words in the bit stream are combined, and the combined length of each such pair is decoded using a prefix combination look-up table (for each qualified code word) which contains a separate prefix combination entry for each possible two-word prefix combination (for that qualified code word). The decoded combined length is then applied to the adder-accumulator circuit of the timing-critical word length decoding loop in order to increment the pointer register of the adder-accumulator circuit by the decoded combined word length, to thereby shift the decoding window of the barrel shifter across the sequence of available bits of the registered input bit stream by the appropriate amount for the next code word(s) to be decoded by the VLD. The code word value decoding process is not timing critical because it is performed outside of the length decoding loop.

Figure 1:
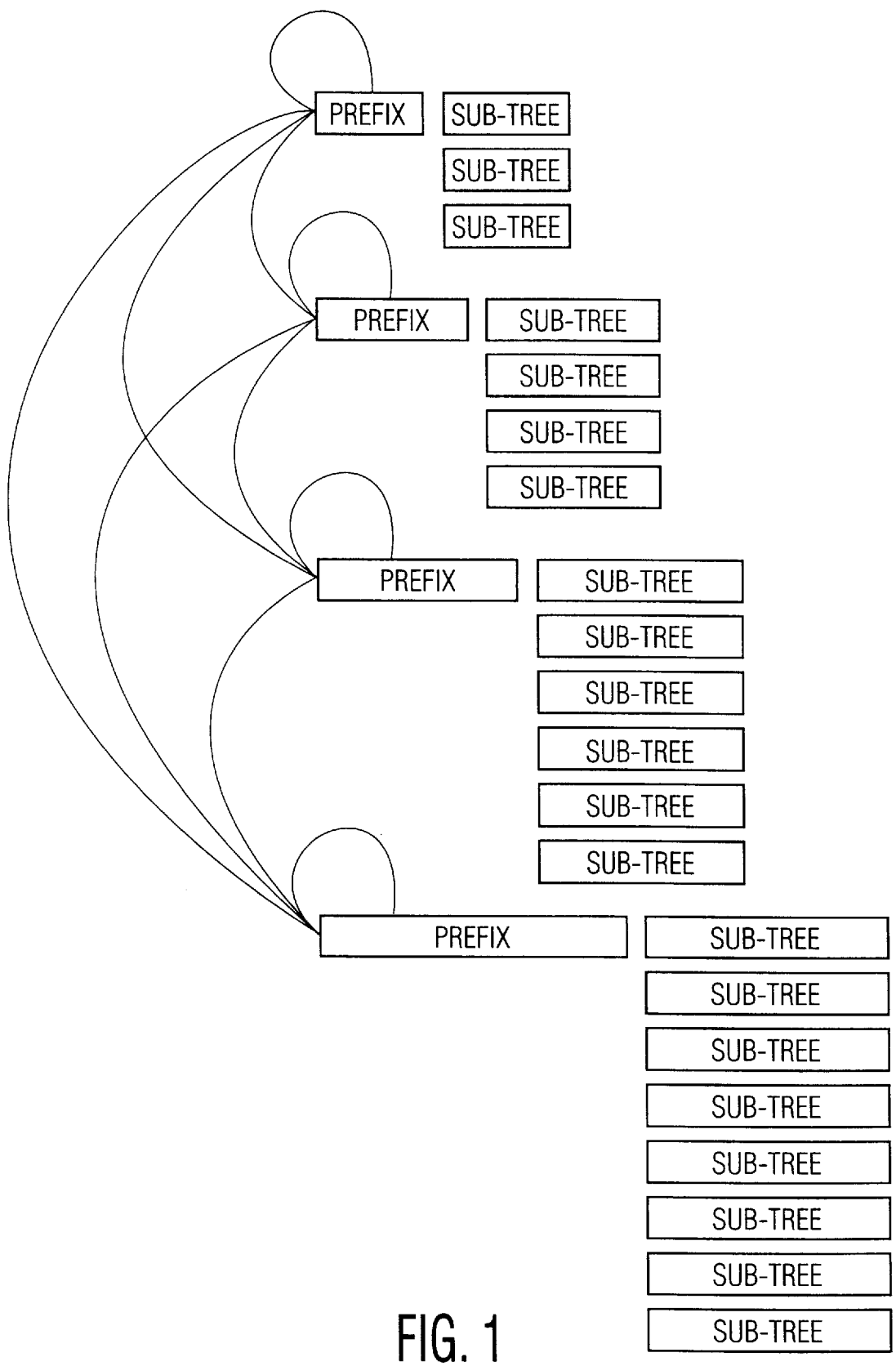
FIG. 1 is a diagram depicting the principle of grouping code words by prefix in a Huffman table.

It will be appreciated that the number of variable length codes in a particular variable length coding (VLC) table can be very large. For example, the MPEG-2 DCT coefficient table zero contains 114 variable length codes. Thus, there would be $114^2$ possible two-word combinations of these unique variable length codes, which would render two-word bit stream segmentation by combining all of these unique codes impractical. However, in the construction of any complex Huffman coding table (such as the MPEG variable length coding tables), and the above table in particular, a unique prefix is normally shared by multiple sub-trees in code words of the same bit length. For example, with reference to FIG. 1, all code words of the same bit length (but having different values) share the same prefix (which defines the length of these code words). Thus, for the example illustrated in FIG. 1 there are four different prefixes corresponding to four different possible code word bit lengths. For each prefix, there are multiple code words of the same bit length, but having different values, as represented by the sub-trees. The above-mentioned MPEG-2 DCT coefficient table zero actually has only 14 length possibilities fully defined by 14 respective unique prefixes. Thus, combining all possible two-word combinations of this type of code word (i.e., DCT coefficients) by their prefixes for the purpose of two-word bit stream segmentation is quite feasible, because decoding the smaller number ($14_2$) of possible two-word prefix combinations using a single decoding table is manageable.

Figure 2:
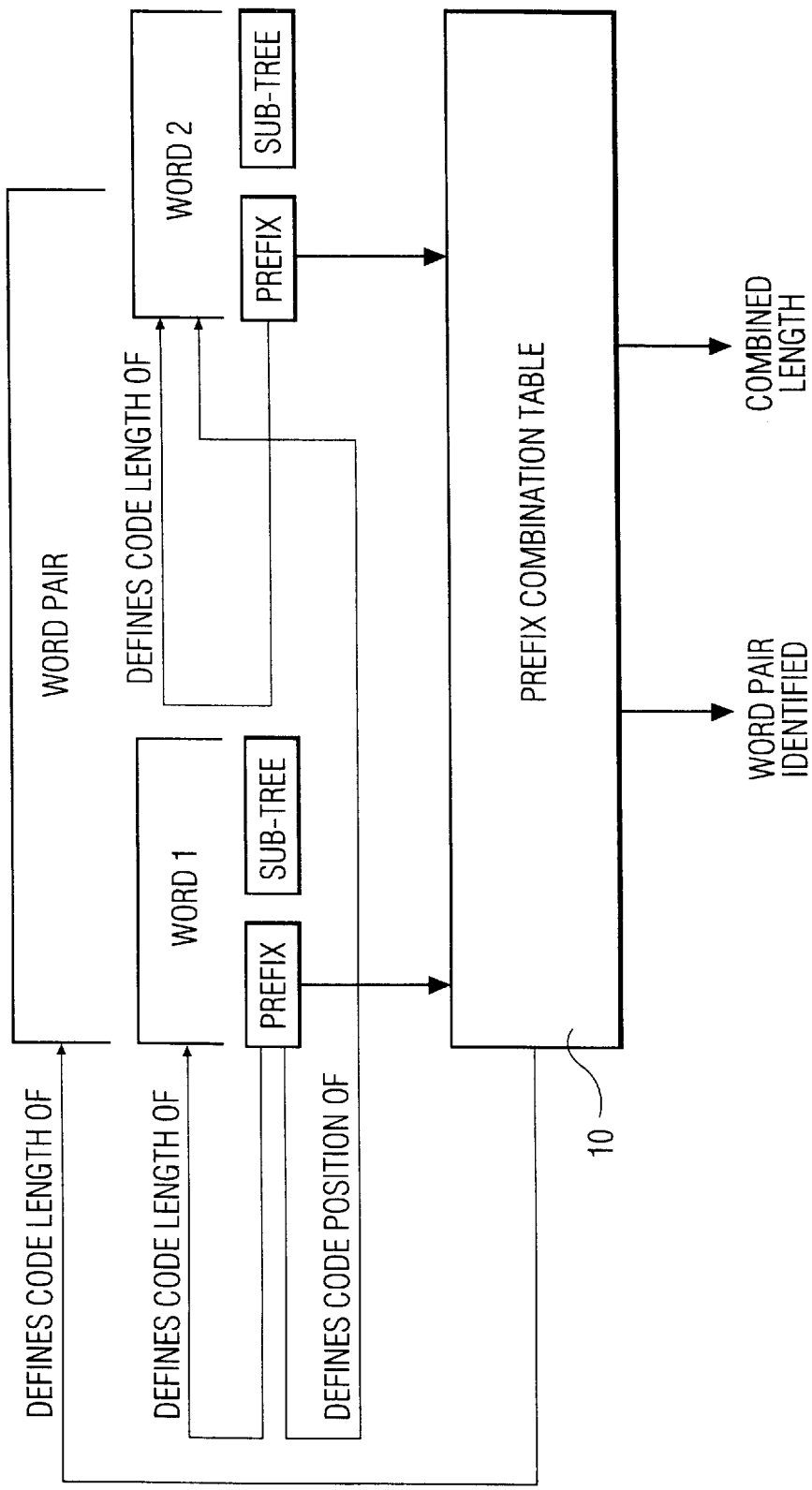
FIG. 2 is a block diagram illustrating the principle of table identification of code word pairs.

With reference now to FIG. 2, the principle of table identification of code word pairs will now be described. More particularly, the bit lengths of two code words WORD 1 and WORD 2 which belong to the same coding table (i.e., of the same code word type), are uniquely identified by their respective prefixes. The prefix of WORD 1 defines both the code length of WORD 1 and the code position of the prefix of WORD 2. The prefix of WORD 2 defines the code length of WORD 2. If both WORD 1 and WORD 2 are included in the prefix combination table 10, the presence of the valid combination is flagged by outputting a "Word Pair Identified" signal. At the same time, the combined length of the code word pair (length of WORD 1+length of WORD 2) is looked-up in the prefix combination table 10, and the looked-up (decoded) combined word length ("Combined Length") is outputted. This table look-up identification of code word pairs by prefixes enables two-word bit stream segmentation, which eliminates the necessity of using a chain of barrel shifters and adders in the timing critical word length decoding loop. In practice, performance (speed and throughput) comparable to that of the VLD disclosed in the above-referenced co-pending application U.S. Pat. No. 5,668,548 can be achieved without utilizing any additional memory and without the need for a pre-VLD.

Figure 3:
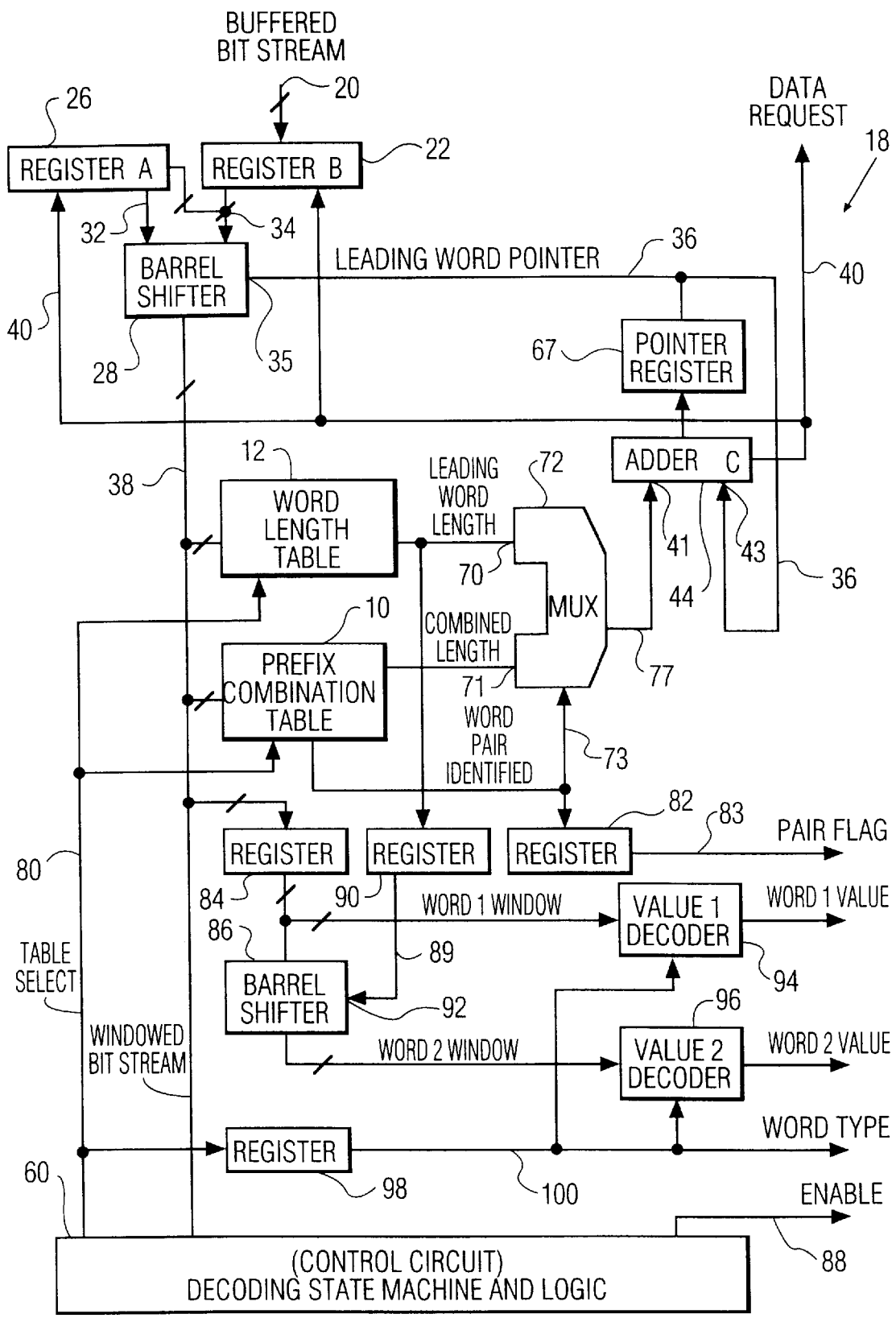
FIG. 3 is a block diagram of an illustrative embodiment of the variable length decoder disclosed in the parent application (Ser. No. 08/672,246)

With reference now to FIG. 3, there can be seen a block diagram of a variable length decoder 18 constructed in accordance with a preferred embodiment of the invention disclosed in the parent application. An input bit stream 20 from a rate buffer (not shown) includes a sequence of variable length code words. The input bit stream 20 is received by a first register 22. In the specific embodiment disclosed in the parent application, the input bit stream 20 is an MPEG digital video data stream which includes payload data and setup data. The payload data, which constitutes the overwhelming majority of the data (about 95% of the data), are represented by such code words as DCT (discrete cosine transform) coefficients and motion vectors, which are decoded using their respective look-up tables. The setup data, which constitutes the remaining portion of the data (about 5% of the data), are represented by other code word types, and are decoded using different look-up tables. The setup data is used by a control circuit 60 comprised of a decoding state machine and associated logic circuitry for directing the decoding process, in accordance with the MPEG decoding protocol.

As previously discussed, the MPEG digital video data stream (input bit stream 20) is a Huffman-encoded bit stream which contains different types of variable length code words. Each of the qualifying types of code words (i.e., code word types qualified for parallel processing) includes a prefix which defines its bit length. Code words of the same type (i.e., belonging to the same coding table) and length, but having different values, share the same prefix.

In accordance with the invention disclosed in the parent application, the code word types corresponding to the payload data are selected to be qualifying code word types, and the code word types corresponding to the setup data are selected to be non-qualifying code word types. As will be described more fully hereinafter, when the "word pair identified" signal output by the prefix combination (look-up) table 10 indicates that the currently decoded input bits of the input bit stream 20 within the output decoding window (i.e., the "windowed bit stream") includes a pair of qualifying code words, then the combined length of that pair of qualifying code words is detected using the prefix combination table 10 (constructed in the manner discussed above in connection with FIG. 2), and the detected combined length is then used to update the leading word pointer which is used to shift the decoding window by the appropriate amount. If it is determined (by the control circuit 60) that the windowed bit stream contains a non-qualifying code word or the "word pair identified" signal output by the prefix combination table 10 indicates that the windowed bit stream includes only a single qualifying code word (as opposed to a pair of qualifying code words), then the length of the code word is detected in the conventional manner using a standard word length (look-up) table 12 according to the detected code word type, under control of the "table select" signal output by the control circuit 60 and the "word pair identified" signal output by the prefix combination table 10.

The first register 22 is connected to a barrel shifter 28 via thirty-two (32) parallel input bit lines 34, each line corresponding to a bit in the first register 22. The second register 26 is connected to the barrel shifter 28 via thirty two (32) parallel input bit lines 32, each line corresponding to a bit in the second register 26. Thus, a total of sixty-four (64) parallel input bit lines 32, 34 are connected to the barrel shifter 28, thereby providing a corresponding sequence of 64 available input bits for the barrel shifter 28. The barrel shifter 28 has a shift input 35 and thirty-two (32) parallel output bit lines 38. Those skilled in the art will appreciate that other numbers of parallel input bit lines 32, 34 and parallel output bit lines 38 may be utilized without departing from the spirit and scope of the present invention. In the specific embodiment disclosed in the parent application, the number of parallel input bit lines 32, the number of parallel input bit lines 34, and the number of parallel output bit lines 38 are each chosen to be equal in number to the maximum number of bits in a code word (i.e., maximum code word length).

In response to a data request signal applied over a data request line 40, a sequence of thirty-two bits representing code words to be decoded is loaded into the first register 22 from the input bit stream 20, while the contents of the first register 22 are transferred to the second register 26 over thirty-two (32) parallel bit lines 24. Thus, a sequence of sixty-four input bits is available to the barrel shifter 28. The thirty-two parallel output bit lines 38 are chosen from the sixty-four parallel input bit lines 32, 34 in a manner discussed below, to thereby provide a decoding window 38 ("windowed bit stream").

The decoding window or windowed bit stream 38 is shifted from left to right across the sequence of available input bits in response to a leading word pointer applied over a line 36 to the shift input 35 of the barrel shifter 28. The decoding window 38 is shifted by the word pointer across the sequence of available input bits according to the length (or combined length) of the code word(s) decoded during a previous clock cycle, so that the start of a next code word(s) to be processed during the current clock cycle begins at the left edge of the decoding window 38.

The value of the leading word pointer applied over the line 36 is summed by an adder 44 with the decoded length or combined length(s) of the code word(s) decoded during a current clock cycle, which is represented by the output of a multiplexer 72 applied over a line 74 to a first input 41 of the adder 44, the leading word pointer being applied over the line 36 to a second input 43 of the adder 44. The output of the adder 44 (which can be considered the "updated leading word pointer") is loaded into a pointer register 64, the output of which is the leading word pointer. (Of course, when the system is initialized, the pointer register 64 is initialized to zero.)

When the sum of the current value of the leading word pointer plus the decoded length or combined length(s) of the code word(s) decoded during the current clock cycle (hereinafter referred to as the "loop sum") exceeds the bit width of the decoding window 38 (i.e., thirty-two in the specific embodiment disclosed in the parent application), the adder 44 overflows or loops around "0", and generates a carry output "C" which is applied to the data request line 40, thus triggering a "data reload" operation, in which the contents of the first register 22 are transferred to the second register 26, and the next sequence of thirty-two bits from the input bit stream 20 are loaded into the first register 22.

When the adder 44 overflows, the output value of the adder 44 is equal to the amount by which the "loop sum" exceeds thirty-two (i.e., "loop sum" minus 32). Thus, the updated leading word pointer registered in the pointer register 64 is equal to this difference, and accordingly, the leading word pointer output by the pointer register 64 shifts the left edge of the decoding window 38 to the input bit (of the sequence of available input bits) whose bit position number is equal to this difference. For example, if the "loop sum" is forty, then the output of the adder is eight, and thus, the word pointer will shift the left edge of the decoding window 38 to the eighth available input bit.

The decoding window or windowed bit stream 38 is input to the control circuit 60 and to both the prefix combination table 10 and the word length table 12. The word length table 12 decodes the length of the leading code word contained in the windowed bit stream 38, in the normal manner, and outputs a "leading word length" signal whose value represents the decoded length of the leading code word. The "leading word length" signal is applied to a first input 70 of the multiplexer 72. The prefix combination table 10 decodes the combined length of a pair of qualifying code words, if any, contained in the windowed bit stream 38, and outputs a "combined length" signal whose value represents the combined bit length of the qualified code word pair. The "combined length" signal is applied to a second input 71 of the multiplexer 72.

The control circuit 60 monitors the windowed bit stream 38 and executes the decoding protocol in order to identify the type(s) of code word(s) which are contained in the windowed bit stream 38 (based upon precious and current decoding results). The control circuit 60 outputs a "table select" signal over a line 80 for selecting the proper look-up table within all of the decoding circuits.

The "table select" signal applied over the line 80 is applied as input to the prefix combination table 10. If the "table select" signal output by the control circuit 60 over line 80 indicates that the windowed bit stream 38 includes a qualifying code word, and the prefix combination table 10 detects a pair of qualifying code words in the windowed bit stream 38, then the "word pair identified" signal output by the prefix combination table 10 over line 73 is set to a first logic state (e.g., logic high level) which indicates that the windowed bit stream 38 contains a pair of qualifying code words (referred to as a "combined length decoding mode"). On the other hand, if either the "table select" signal output by the control circuit 60 over line 80 indicates that the windowed bit stream 38 includes a non-qualifying code word, or the prefix combination table 10 does not detect a pair of qualifying code words in the windowed bit stream 38 (e.g., if the windowed bit stream 38 contains only a single qualifying code word), then the "word pair identified" output by the prefix combination table 10 is set to a second logic state (e.g., logic low level) which indicates that the windowed bit stream 38 does not contain a pair of qualifying code words (referred to as the "single (or standard) word length decoding mode").

The "word pair identified" signal is applied to the control or select input 73 of the multiplexer 72 and is registered by a register 82. If the "word pair identified" signal is in its first logic state, indicating that the VLD 18 is in the combined length decoding mode, then the output "combined length" of the prefix combination table 10 is selected as the output of the multiplexer 72 and applied over the line 74 to the first input 41 of the adder 44 for use in updating the "leading word pointer" applied over the line 36 to the shift input 35 of the barrel shifter 28. On the other hand, if the "word pair identified" signal is in its second logic state, indicating that the VLD 18 is in the single word length decoding mode, then the output "leading word length" of the word length table 12 is selected as the output of the multiplexer 72 and applied over the line 74 to the first input 41 of the adder 44 for use in updating the "leading word pointer" applied over the line 36 to the shift input 35 of the barrel shifter 28. The registered "word pair identified"signal is output by the register 82 over the line 83 as a "pair flag" which indicates whether one or two code words are currently present at the VLD output.

The windowed bit stream 38 is registered by a register 84, and the registered window bit "word 1 window" output by the register 84 is applied to both a barrel shifter 86 and to a value 1 decoder 94. The "leading word length" signal output by the word length table 12 is applied to a register 90, and the registered "leading word length" signal is applied over a line 89 to a shift input 92 of the barrel shifter 86, to thereby shift the output decoding window of the barrel shifter 86 to the start of the second code word (if any) in the registered window bit stream output by the register 84. The windowed bit stream output "word 2 window" of the barrel shifter 86 is applied to a value 2 decoder 96.

The "table select" signal output by the control circuit 60 is registered by a register 98, and the registered "table select" signal output by the register 98 is applied to respective table select inputs of the value 1 and value 2 decoders 94, 96, to thereby select the proper look-up table for decoding the values of the first code word and second code word (if any), respectively, contained within the windowed bit stream 38. The output of register 98 is applied over line 100 to the VLD output to identify the code word type presented at the outputs of the value 1 and value 2 decoders 94, 96. The control circuit 60 also outputs an "enable" signal over a line 88 validating the current output state.

The above-described method and VLD architecture of the invention disclosed in the parent application provides several advantages over prior solutions. As previously mentioned, high performance at lower clock rates of operation can be achieved without the extra expense of added hardware complexity and additional memory, thereby rendering this VLD architecture very suitable for consumer digital HDTV decoders. Another advantage of this VLD architecture is that is provides good handling of local activity in terms of code word peak rates, thereby overcoming the previously described shortcoming of the VLD disclosed in the co-pending application U.S. Pat. No. 5,650, 905. The capability of the VLD having this architecture to handle peak rates locally is achieved by combining all code words by their prefixes in the prefix combination table, and then using the prefix combination table to achieve two-word bit stream segmentation, as opposed to one-word bit stream segmentation (as done in the previously developed VLDs). As mentioned, good handling of local activity is very important for subsequent real-time picture processing.

Further, it should be understood that although the preferred embodiment disclosed in the parent application utilizes two-word bit stream segmentation, it should be appreciated that the invention disclosed in the parent application broadly encompasses M-word bit stream segmentation, where M $\geq 2$(e.g., M could be prescribed to be 3 or more).

It should also be understood that although the specific embodiment disclosed in the parent application employs a VLD architecture in which the decoding window 38 is thirty-two bits wide, in order to guarantee failure-free peak code word throughput on the macroblock level, it is necessary to provide a decoding window 38 whose bit width is at least equal to double the length of the maximum-length qualifying code word. In the case of the MPEG-2 protocol, the maximum-length qualifying code word is a 24-bit DCT coefficient. Thus, the decoding window 38 (i.e.. the output bit width of the barrel shifter 28) must be 48 bits wide in order to ensure failure-free peak code word throughput on the macroblock level. However, as previously mentioned, the 48-bit VLD structure has a reduced speed of operation and a higher gate count in silicon than a VLD structure having a decoding window 38 which has a smaller bit width, and thus, is less economical than desirable.

Thus, in the practical VLD implementation in which the decoding window 38 is 32 bits wide, the occurrence of qualifying code word pairs of bit lengths 24+9, 9+24, 10+24, 24+16, etc. will cause the VLD 18 to switch to the singular word length decoding mode, thereby resulting in a commensurate loss of throughput. If the number of code words which are not parallel-processed or "pair-matched" due to their combined length exceeding the bit width of the decoding window exhausts the VLD's clock cycle allocation per macroblock, the VLD 18 will fail to finish decoding the macroblock in real-time. Thus, the 32-bit implementation of the VLD 18 would not be "failure-free" (i.e.. immune to failures), and thus, would not meet the most stringent requirements of some contemporary digital HDTV video decoders.

Accordingly, it is a goal of the present invention to overcome this shortcoming of the VLD 18 disclosed in the parent application. This goal of the present invention is accomplished by transforming the Huffman coding of at least prescribed ones of the qualifying code words. such as DCT coefficients, before the input bit stream 20 is processed by the VLD 18, in such a manner that the resultant total bit length of any pair of the prescribed ones of the qualifying code words will not exceed the bit width of the decoding window 38 (i.e., the output bit-width of the barrel shifter 28), thereby guaranteeing that the combined length of all pairs of the prescribed ones of the qualifying code words which are "pair-matched" for parallel processing will not exceed the bit width of the decoding window 38, and thus. would guarantee that no peak data throughput performance would be sacrificed. This technique of transforming the Huffman coding of at least prescribed ones of the qualifying code words will hereinafter be referred to as "pair-match Huffman transcoding".

It will be appreciated by those skilled in the pertinent art that the rate buffer is typically designed (for most applications) to have a size which is sufficient to store all of the code words for a worst-case scenario. Thus, if the pair-match Huffman transcoding of the input bit stream 20 results in transcoded code words having a bit length greater than that of the original code words, the required size of the rate buffer increases commensurately. Thus, as will become more fully apparent hereinafter, this technique of pair-match Huffman transcoding the input bit stream 20 is preferably carried out in such a manner that the transcoded code words are mapped in such a way that their bit lengths do not exceed the lengths of the corresponding original code words by more than the smallest possible mapping ratio in order to thereby ensure that the rate buffer size increase occasioned by the pair-match Huffman transcoding of the input bit stream 20 is minimized.

With the MPEG-2 protocol, an escape sequence is a fixed length code which is used by an MPEG-2 encoder when a required combination of run and level cannot be found in a Huffman table. The encoder transmits a unique 6-bit escape symbol which is decoded as a variable length code word which indicates that what follows is a fixed length 6-bit run value and a fixed length 12-bit level value. The run value (or simply "run") represents the number of "zero" DCT coefficients preceding the current word and not transmitted by the encoder, and the 12-bit level value (or simply "level") represents the coefficient magnitude. Thus, the DCT escape sequence has a fixed length of 24 bits. In MPEG-2 unconstrained macroblocks, a number of long DCT escape sequences can potentially be equal to the maximum number of DCT coefficients.

It will be appreciated by those skilled in the pertinent art that every coefficient with a run value other than "zero" creates a "hole" in the VLD throughput demand. A full set of "zero-run" DCT coefficients in a macroblock means that all coefficient positions in the macroblock are occupied (which indicates low or no spatial compression) and the full throughput is required in terms of the number of code words that must be processed by the VLD in the allocated time period for processing the macroblock. On the other hand, the presence of DCT coefficients with run values other than "zero" in a macroblock means that less than all of the coefficient positions in the macroblock are occupied (i.e., at least one of the coefficient positions in the macroblock is unoccupied), which indicates the presence of spatial compression.

Figure 4:
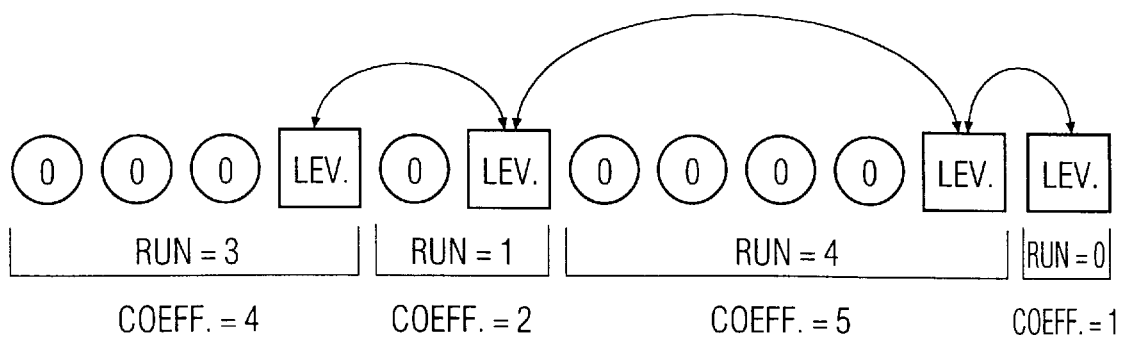
FIG. 4 is a diagrammatically representation of a sequence of 4 MPEG-2 symbols which actually represents 12 DCT coefficients.

With reference now to FIG. 4. there can be seen a sequence of symbols which actually represents 12 DCT coefficients. The first symbol in the sequence has a run value of 3, and thus, actually represents 4 coefficients, namely, three "zero" coefficients and one "non-zero"coefficient. The second symbol in the sequence has a run value of 1, and thus, actually represents 2 coefficients, namely, 1 "zero" coefficient and one "non-zero" coefficient. The third symbol in the sequence has a run value of 4, and thus, actually represents 5 coefficients, namely. 4 "zero" coefficients and one "non-zero" coefficient. The fourth symbol in the sequence has a run value of 0, and thus, constitutes a single "non-zero" coefficient. Thus, the sequence of 4 symbols illustrated in FIG. 4 represents a total of 12 coefficients, thus lowering the VLD's throughput demand by 8 code words for this particular sequence, i.e., thus creating 8 "holes" in the VLD throughput demand.

In order to guarantee that the VLD 18 having a 32-bit-wide decoding window 38 processes the input bit stream 20 with double throughput and without failure, it must be ensured that all transcoded Huffman symbols as well as all escape sequences with runs less than 2 (i.e., with runs of 0 and 1 ) are transcoded into code words having no more than $32/2=16$ bits. With pair-match Huffman transcoding of the input bit stream 20 in accordance with these transcoding parameters, only the 24-bit DCT coefficient escape sequences with runs of 0 and 1 will be pair-matched among themselves and with all Huffman symbols. The 24-bit DCT escape sequences with runs 2 and higher will not have to be transcoded to ensure "failure-free" double throughput of the VLD 18 having a 32-bit-wide decoding window 38, since 24-bit escape sequences with runs 2 and higher represent at least 3 coefficients—two "zero" coefficients and one "non-zero" coefficient. If such a word is followed by a word which does not make a pair (i.e., a "non-pair-matching" word) with either this word or the next word, these two non-pair-matched words will not be processed in parallel, but will nevertheless effectively represent at least four coefficients processed in two clock cycles, which therefore guarantees double throughput VLD performance in this worst-case situation.

Figure 5:
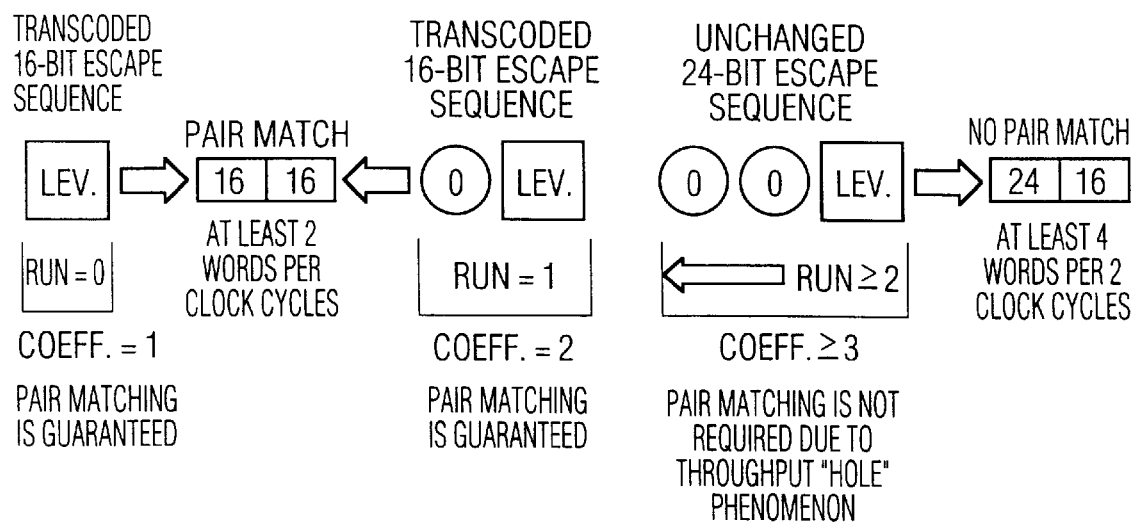
FIG. 5 is a general diagrammatical illustration of the transcoding of smaller-run DCT coefficient escape sequences in such a manner as to guarantee double throughput, which constitutes one aspect of the pair-match Huffman transcoding method of the present invention.

The above-described process of pair-match Huffman transcoding is diagrammatically illustrated in FIG. 5. In general, if this form of pair-match Huffman coding is employed, the resultant 16-bit transcoded DCT escape sequences with runs 0 and 1 are guaranteed to be pair-matched with all qualifying Huffman symbols (since the maximum length qualifying Huffman code word is 16 bits) and amongst themselves, thereby ensuring double throughput. The non-transcoded (i.e., original) 24-bit, larger-run (i.e., run $\geq 2$) DCT escape sequences will not be pair-matched with qualifying Huffman symbols having bit lengths $\geq 9$. However, due to the three-coefficient representation in clock cycle 1 and at least one-coefficient representation in clock cycle 2, a total of at least 4 effective coefficients are processed in two clock cycles, thereby ensuring double throughput. The non-pair-matching combinations amongst the non-transcoded, 24-bit, larger-run (>2) DCT escape sequences are less critical, with a total of at least 6 coefficients processed in 2 clock cycles.

Figure 6:
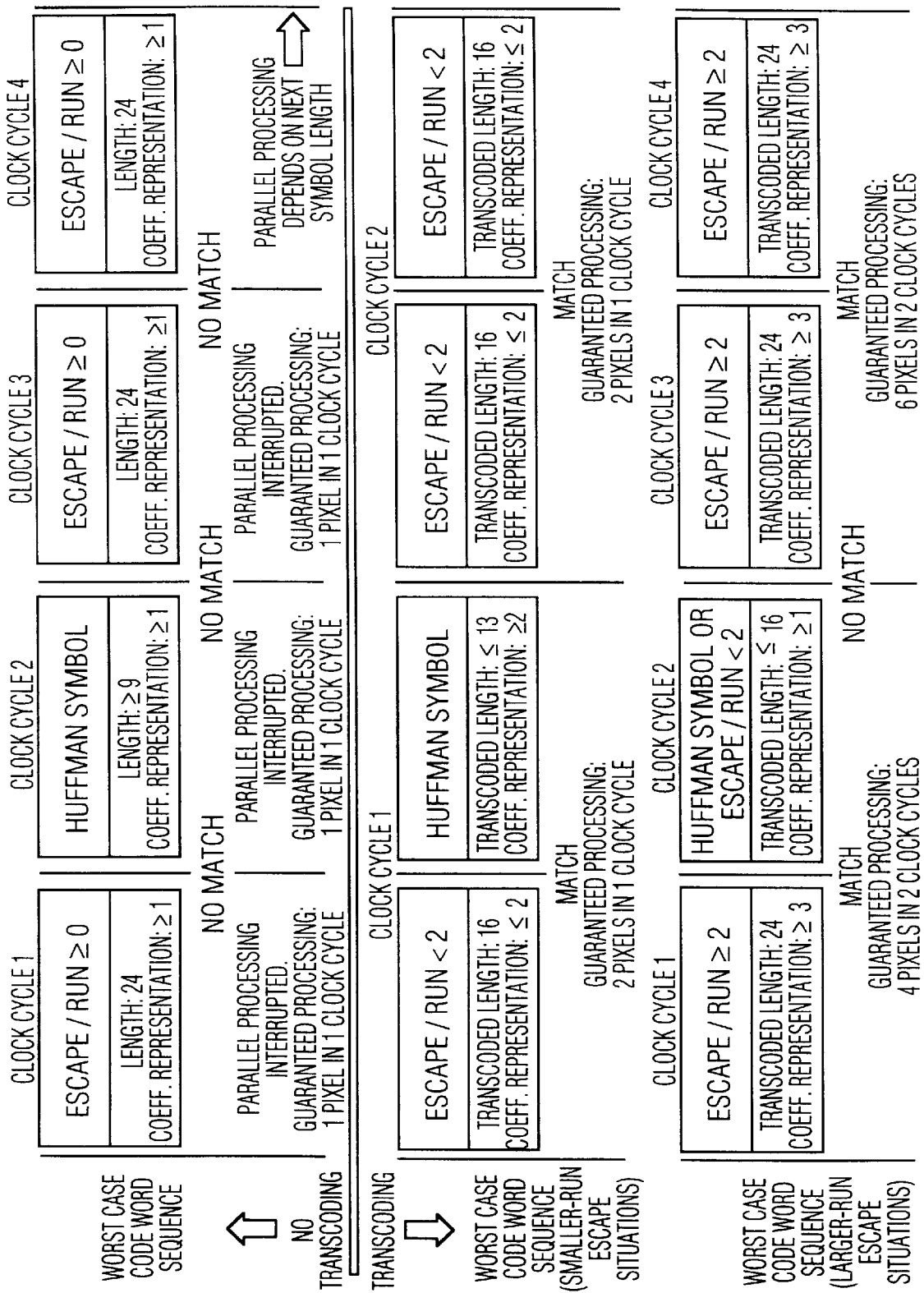
FIG. 6 is a diagrammatical illustration which compares the parallel processing of the worst case symbol combinations in a parallel 32-bit VLD architecture which does not employ the pair-match Huffman transcoding method of the present invention, with the parallel processing of the same worst case symbol combinations in a parallel 32-bit VLD architecture which does employ the pair-match Huffman transcoding method of the present invention.

The improvement in parallel processing of the worst case symbol combinations due to the above-described method of pair-match Huffman transcoding is illustrated in FIG. 6. As can be seen, in a parallel 32-bit VLD architecture in which no pair-match Huffman transcoding is used, the combinations of 24-bit DCT escape sequences (any run) with Huffman symbols having a bit length of $\geq 9$, or amongst themselves, will result in no pair match and no parallel processing, and thus, a 50% loss in data throughput. As described above, in the case of a parallel 32-bit VLD architecture in which pair-match Huffman transcoding is used, double throughput is guaranteed, for all combinations of qualifying code words.

Figure 7:
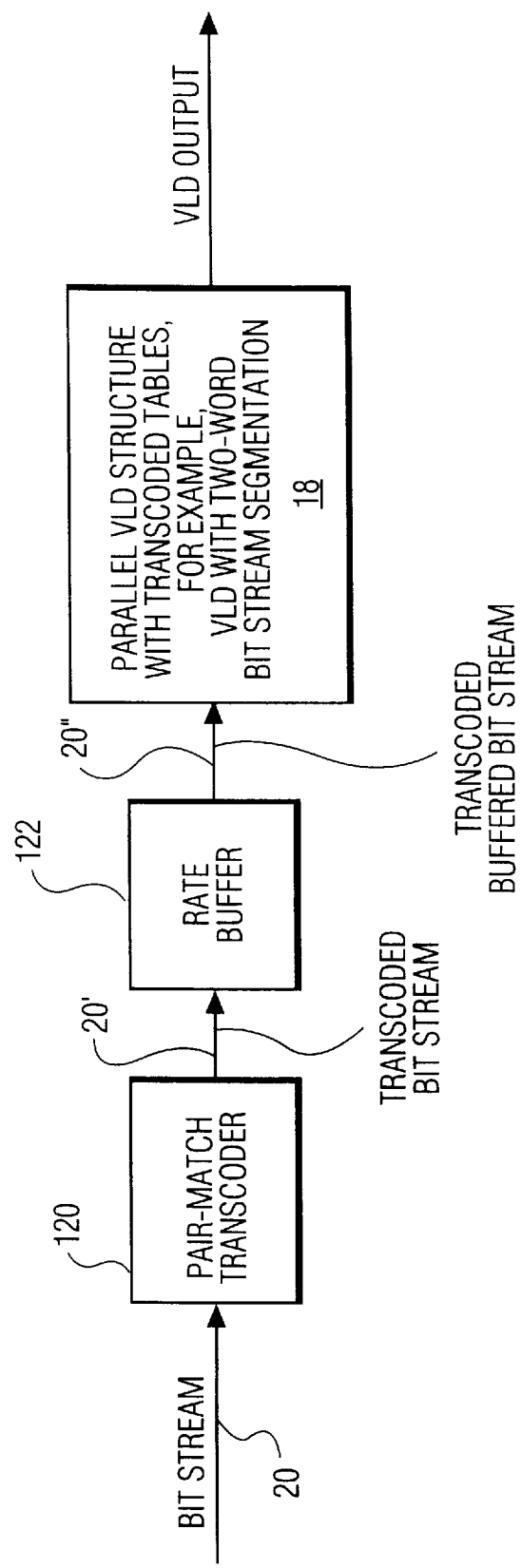
FIG. 7 is a block diagram of the preferred hardware configuration for implementing the pair-match Huffman transcoding method of the present invention in combination with the VLD depicted in FIG. 3.

With reference now to FIG. 7, there can be seen a block diagram of the preferred hardware configuration for implementing the pair-match Huffman transcoding method of the present invention in combination with the VLD 18 described hereinabove. More particularly, a pair-match transcoder 120 is provided in front of a rate buffer 122 in order to perform the pair-match Huffman transcoding of the input bit stream 20, and to thereby produce a transcoded bit stream 20' at its output. The transcoded bit stream 20' is buffered by the rate buffer 122, which produces a buffered transcoded bit stream 20" at its output. The buffered transcoded bit stream 20" is then provided as an input to the VLD 18, rather than the original input bit stream 20. However, it should be clearly understood that the pair-match Huffman transcoding method of the present invention can be employed in conjunction with any other suitable parallel VLD architecture.

The two-word bit stream segmentation and parallel processing of qualifying code words is then performed by the VLD 18 in the same manner as described hereinabove, with the exception that the look-up tables employed to decode the lengths and values of the code words contained in the buffered transcoded bits stream 20" are modified in accordance with the particular pair-match Huffman transcoding scheme utilized. A particular implementation of a pair-match Huffman transcoding method which can be utilized in the practice of the present invention follows.

More particularly, with reference to FIGS. 8 and 9, there can be seen Tables 1 and 2 which correspond to the MPEG-2 DCT Coefficient Tables 0 and 1, respectively, and which illustrate both the original ("old") symbols and the transcoded symbols which are obtained as a result of a particular implementation of the pair-match Huffman transcoding method of the present invention. As can be seen, in accordance with this particular implementation of the pair-match Huffman transcoding method of the present invention, selected ones of the old symbols in the MPEG-2 DCT Coefficient Tables 0 and 1 are modified by adding a single bit to the end thereof. In accordance with this particular scheme, if the added bit is logic "0", then the trancoded symbol is accorded the same meaning as the old symbol. However. if the added bit is logic "1 ", then the transcoded symbol is accorded a different meaning from that of the old symbol.

In particular, with specific reference to Table 1 depicted in FIG. 8, the old symbol "11s" (where s is a designated sign bit) is transcoded into a transcoded symbol "110s" or "111". The transcoded symbol "110s" has the same meaning as the old symbol "11s" (i.e., run 0, level 1), whereas the transcoded symbol "111" represents a six-bit DCT coefficient escape sequence symbol, as well as a run word having a run 0 value, with the following twelve bits (indicated as

[+12]") being used to represent the level (magnitude) of the DCT coefficient. Thus, an original 24-bit escape sequence comprised of a 6-bit DCT coefficient escape sequence symbol, a 6-bit run word, and a 12-bit level word has been successfully transcoded into a transcoded 15-bit DCT coefficient escape sequence. This meets the criterion that all transcoded symbols have a bit length no greater than $32/2=16$, in the case where the output decoding window 38 of the VLD 18 is 32 bits wide.

The "mapping ratio" indicates the ratio of the number of bits in the old symbol to the number of bits in the transcoded symbol. As can be easily seen, the mapping ratio of the transcoded symbol "110s" to the old symbol "11s" is 4/3, since the transcoded symbol having the same meaning as the old symbol requires 4 bits, as compared with the 3 bits which the old symbol requires. This requires a 33.33% increase in the required size of the rate buffer 122 relative to an embodiment in which pair-match Huffman transcoding is not utilized (i.e., the original (old) look-up tables are utilized), in order to accomodate the worst case situation (which is highly improbable) in which all the picture data are represented by a sequence of only this code word. By contrast, the mapping ratio of the transcoded symbol "111 [+12]" to the old 24-bit DCT coefficient escape sequence is 15/24, since the transcoded symbol having the same meaning as the old symbol requires 15 bits, as compared with the 24 bits which the old symbol requires. Thus, the required size of the rate buffer 122 for handling a worst case picture represented by a sequence of only this code word is actually decreased by 37.50%.

With continuing reference to Table 1 depicted in FIG. 8, the old symbol "011s" is transcoded into atranscoded symbol "0110s" or "0111". The transcoded symbol "0110s" has the same meaning as the old symbol "011s" (i.e., run 1 level 1), whereas the transcoded symbol "0111" represents a six-bit DCT coefficient escape sequence symbol, as well as a run word having a run 1 value, with the following twelve bits (indicated as [+12]) being used to represent the level (magnitude) of the DCT coefficient. Thus, an original 24-bit escape sequence comprised of a 6-bit DCT coefficient escape sequence symbol, a 6-bit run word, and a 12-bit level word has been successfully transcoded into a transcoded 16-bit DCT coefficient escape sequence. This meets the criterion that all transcoded symbols have a bit length no greater than $32/2=16$, in the case where the output decoding window 38 of the VLD 18 is 32 bits wide.

As can be easily seen, the mapping ratio of the transcoded symbol "0110s" to the old symbol "011s" is 5/4, since the transcoded symbol having the same meaning as the old symbol requires 5 bits, as compared with the 4 bits which the old symbol requires. This requires a 25.00% increase in the required size of the rate buffer 122 relative to an embodiment in which pair-match Huffman transcoding is not utilized (i.e., the original (old) look-up tables are utilized). By contrast, the mapping ratio of the transcoded symbol "0111 [+12]" to the old 24-bit DCT coefficient escape sequence is 16/24, since the transcoded symbol having the same meaning as the old symbol requires 16 bits, as compared with the 24 bits which the old symbol requires. Thus, the required size of the rate buffer 122 for handling a worst case picture represented by a sequence of only this code word is actually decreased by 33.33%.

With continuing reference to Table 1 depicted in FIG. 8, the old symbol "0100s" is transcoded into a transcoded symbol "0100s" or "01001". The transcoded symbol "01000s" has the same meaning as the old symbol "0100s" (i.e., run 0, level 2), whereas the transcoded symbol "01001" indicates that the following eight bits (indicated as [+8]) represent the Huffman symbols of DCT coefficients having a bit length of $\geq 11$. Thus, an original (old) DCT coefficient having a bit length of 11–17 bits has been successfully transcoded into a fixed length 13 bit transcoded DCT coefficient which represents all old DCT coefficients between 11 and 17 bits long. This meets the criterion that all transcoded symbols have a bit length no greater than $32/2=16$, in the case where the output decoding window 38 of the VLD 18 is 32 bits wide.

As can be easily seen, the mapping ratio of the transcoded symbol "01000s" to the old symbol "0100s" is 6/5, since the transcoded symbol having the same meaning as the old symbol requires 6 bits, as compared with the 5 bits which the old symbol requires. This requires a 20.00% increase in the required size of the rate buffer 122 relative to an embodiment in which pair-match Huffman transcoding is not utilized (i.e., the original (old) look-up tables are utilized). The mapping ratio of the transcoded symbol "01001 [+8]" to the old DCT coefficients having bit lengths 11 to 17 is between 13/17 to 13/11, depending upon the bit length of the old DCT coefficient which has been transcoded. Thus, the required size of the rate buffer 122 for handling a worst case picture represented by a sequence of only this code word falls in a range of −23.50% to +18.20% of the required size of the rate buffer 122 for an embodiment of the VLD 18 in which no pair-match Huffman transcoding is employed.

Since the number of possible prefix combinations is equal to the square of the number of different prefixes, the total number of prefix combinations which are required to be entered into the transcoded prefix combination look-up table is reduced by 3.06 times (i.e., 306%) relative to the prefix combination look-up table required in connection with an embodiment of the VLD 18 in which no pair-match Huffman transcoding as described above is utilized. Otherwise stated, the number of possible old prefix combinations is $14^2=196$, and the number of possible transcoded prefix combinations is $8^2=64$.

Further, since the required size of the transcoded prefix combination look-up table is so dramatically reduced relative to the required size of the old prefix combination look-up table, the propagation delay of this timing-critical component of the timing-critical length decoding loop can be commensurately reduced. This allows the VLD 18 which employs pair-match Huffman transcoding to be operated at a higher clock rate (if necessary), with smaller logic resources, and with the potential of even higher data throughput. Applications which could realize this potential include professional HDTV decoders which support the 4:2:2 and 4:4:4 chroma formats.

With specific reference now to Table 2 depicted in FIG. 9, the old symbol "010s" is transcoded into a transcoded symbol "0100s" or "0101". The transcoded symbol "0100s" has the same meaning as the old symbol "010s" (i.e., run 1, level 1), whereas the transcoded symbol "0101" represents a six-bit DCT coefficient escape sequence symbol, as well as a run word having a run 0 value, with the following twelve bits (indicated as [+12]) being used to represent the level (magnitude) of the DCT coefficient. Thus, an original 24-bit escape sequence comprised of a 6-bit DCT coefficient escape sequence symbol, a 6-bit run word, and a 12-bit level word has been successfully transcoded into a transcoded 16-bit DCT coefficient escape sequence. This meets the criterion that all transcoded symbols have a bit length no greater than $32/2=16$, in the case where the output decoding window 38 of the VLD 18 is 32 bits wide.

As can be easily seen, the mapping ratio of the transcoded symbol "0100s" to the old symbol "010s" is 5/14, since the transcoded symbol having the same meaning as the old symbol requires 5 bits, as compared with the 4 bits which the old symbol requires. This requires a 25.00% increase in the required size of the rate buffer 122 relative to an embodiment in which pair-match Huffman transcoding is not utilized (i.e., the original (old) look-up tables are utilized), in order to accomodate the worst case situation (which is highly improbable) in which all the picture data are represented by a sequence of only this code word. By contrast, the mapping ratio of the transcoded symbol "0101 [−12]"to the old 24-bit DCT coefficient escape sequence is $16/24$, since the transcoded symbol having the same meaning as the old symbol requires 16 bits, as compared with the 24 bits which the old symbol requires. Thus, the required size of the rate buffer 122 for handling a worst case picture represented by a sequence of only this code word is actually decreased by 33.33%.

With continuing reference to Table 2 depicted in FIG. 9, the old symbol "110s" is transcoded into a transcoded symbol "1100s" or "1101". The transcoded symbol "1100s" has the same meaning as the old symbol "110s" (i.e., run 0, level 2), whereas the transcoded symbol "1101" represents a six-bit DCT coefficient escape sequence symbol, as well as a run word having a run 1 value, with the following twelve bits (indicated as [+12]) being used to represent the level (magnitude) of the DCT coefficient. Thus, an original 24-bit escape sequence comprised of a 6-bit DCT coefficient escape sequence symbol, a 6-bit run word, and a 12-bit level word has been successfully transcoded into a transcoded 16-bit DCT coefficient escape sequence. This meets the criterion that all transcoded symbols have a bit length no greater than $32/2=16$, in the case where the output decoding window 38 of the VLD 18 is 32 bits wide.

As can be easily seen, the mapping ratio of the transcoded symbol "1100s" to the old symbol "110s" is $5/4$, since the transcoded symbol having the same meaning as the old symbol requires 5 bits, as compared with the 4 bits which the old symbol requires. This requires a 25.00% increase in the required size of the rate buffer 122 relative to an embodiment in which pair-match Huffman transcoding is not utilized (i.e.. the original (old) look-up tables are utilized). By contrast, the mapping ratio of the transcoded symbol "1101 [+12]" to the old 24-bit DCT coefficient escape sequence is $16/24$, since the transcoded symbol having the same meaning as the old symbol requires 16 bits, as compared with the 24 bits which the old symbol requires. Thus, the required size of the rate buffer 122 for handling a worst case picture represented by a sequence of only this code word is actually decreased by 33.33%.

With continuing reference to Table 2 depicted in FIG. 9, the old symbol "0110" is transcoded into a transcoded symbol "01100" or "01101". The transcoded symbol "01100" has the same meaning as the old symbol "0110" (i.e., "End of Block"), whereas the transcoded symbol "01101" indicates that the following eight bits (indicated as [+8]) represent the Huffman symbols of DCT coefficients having a bit length of $\geq 11$. Thus, an original (old) DCT coefficient having a bit length of 11–17 bits has been successfully transcoded into a fixed length 13 bit transcoded DCT coefficient which represents all old DCT coefficients between 11 and 17 bits long. This meets the criterion that all transcoded symbols have a bit length no greater than $32/2=16$, in the case where the output decoding window 38 of the VLD 18 is 32 bits wide.

As can be easily seen, the mapping ratio of the transcoded symbol "01100" to the old symbol "0110" is $5/4$, since the transcoded symbol having the same meaning as the old symbol requires 5 bits, as compared with the 4 bits which the old symbol requires. This requires a 25.00% increase in the required size of the rate buffer 122 relative to an embodiment in which pair-match Huffman transcoding is not utilized (i.e., the original (old) look-up tables are utilized). The mapping ratio of the transcoded symbol "01101 [+8]"to the old DCT coefficients having bit lengths 11 to 17 is between $13/17$ to $13/11$, depending upon the bit length of the old DCT coefficient which has been transcoded. Thus, the required size of the rate buffer 122 for handling a worst case picture represented by a sequence of only this code word falls in a range of −23.50% to +18.20% of the required size of the rate buffer 122 for an embodiment of the VLD 18 in which no pair-match Huffman transcoding is employed.

It is also important to recognize that the transcoded MPEG-2 DCT Coefficient Table 0 and the transcoded MPEG-2 DCT Coefficient Table 1 will have code words of only 8 different word lengths, as opposed to the 14 different word lengths required in the original MPEG-2 DCT Coefficient Tables 0 and 1 since all original DCT coefficients having a length of between 11 to 17 bits are transcoded into transcoded DCT coefficients having the same bit length (i.e., 13 bits), with the same 5-bit prefix and an 8-bit fixed length sub-tree representing all corresponding values. Thus, rather than having words with 14 different bit lengths, as in the old Tables, the transcoded Tables only have words with 8 different bit lengths.

According to the particular implementation of the pair-match Huffman transcoding method of the present invention described hereinabove, the maximum rate buffer size increase necessitated thereby is 33.33%, in order to accomodate the worst case scenario (which is highly improbable) in which an entire picture to be decoded is represented by a sequence of only the worst case code word. The actual required rate buffer size increase is almost certainly lower because of the near impossibility of this worst case scenario, and due to multiple cases where the code word lengths are actually reduced or remain unchanged. In any event, the worst case rate buffer size increase of 33.33% is a big improvement over the VLD architectures which use bit stream tagging to improve the VLD performance at a cost of a required 100% rate buffer size increase. Furthermore, the small rate buffer size increase may not be a considerable issue for the following reasons. The Main Profile High Level (HDTV level) of MPEG-2 specifies a rate buffer size of 9,781,248 Mbits. Commercially available memories come in "power-of-two" sizes. Thus, the presently commerically available memory having a size closest to the specified size is a 16 Mbit memory device. Thus, since the maximum rate buffer size required for a VLD which employs the above-described exemplary pair-match Huffman transcoding method of the present invention is 13,014,664 Mbits. no real trade-off is required. Moreover, the recent dramatic decline in memory prices further minimizes the importance of the memory size/cost issue.

It will be appreciated by those skilled in the pertinent art that since the doubled throughput per clock cycle for the payload bit sream data processing is guaranteed by the method of the present invention, the VLD with two-bit bit stream segmentation which utilizes this method is capable of operating at reasonably low clock rates while delivering the required data throughput in real-time. Savings in memory cost along with the architectural benefits of non-partitioned low-memory requirement decoding schemes can be substantial. In professional 4:2:2 and 4:4:4 VLD implementations, just the feasibility of a traditional single-VLD decoder is questionable due to the VLSI technology limitations with regard to the required "exotic" processing clock rates.

Figure 10:
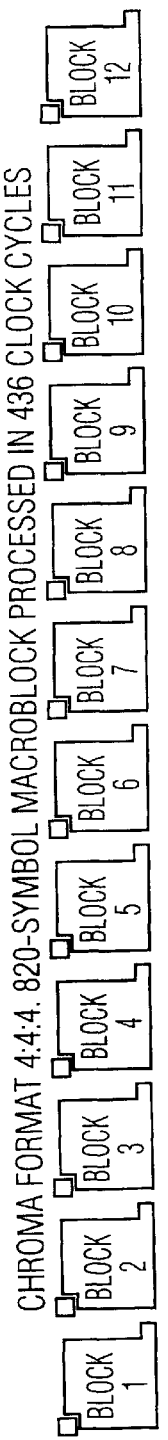

The VLD throughput enhancement characteristics for real-time processing of 1920×1088 HDTV pictures for different chroma formats are presented in FIG. 10. The macroblock structure consists of a macroblock header followed by a maximum of 6, 8, or 12 luminance and chrominance blocks for chroma formats 4:2:0, 4:2:2, and 4:4:4, respectively.

The macroblock header is processed in the VLD using a traditional single-word segmentation method. Accounting for processing inefficiencies, the macroblock header is assumed to have 40 symbols processed in the same number of clock cycles. For the sake of simplicity, it is assumed that the motion vectors present in the macroblock header are processed in a traditional manner, even though they qualify, for parallel processing as well as the DCT coefficients.

In the Intra macroblocks, the DC coefficients are encoded differently from the AC coefficients, and are thus processed in a traditional manner (i.e., 1 clock cycle per DC coefficient). The remaining maximum of 63 AC coefficients and the End of Block (EOB) are guaranteed to match the maximum of 32 pairs per block, and therefore require the maximum of 32 clock cycles to be processed. In the non-Intra macroblocks, all DCT coefficients and the EOB (the maximum of 65 symbols per block) can be processed in parallel. In both cases, processing a block of DCT coefficients is guaranteed to be performed in 33 clock cycles.

With reference to FIG. 10, it can be seen that the worst-case 430-symbol 4:2:0 macroblock can be processed in 238 clock cycles, the worst-case 560-symbol 4:2:2 macroblock in 340 clock cycles, and the worst-case 820-symbol 4:4:4 macroblock in 436 clock cycles. Based on these results, the throughput enhancement characteristics are presented in FIG. 10 for different chroma formats. The throughput enhancement factor characterizes the efficiency of the different types of VLDs. This factor is defined as the ratio between the number of actual symbols per macroblock and the number of clock cycles required for their processing. The throughput enhancement factor is equal to one in the VLD with single-word bit stream segmentation. For the VLD with two-word bit stream segmentation and Huffman transcoding according to the present invention, the throughput enhancement factor is 1.81 for the 4:2:0 chroma format, 1.84 for the 4:2:2 chroma format, and 1.88 for the 4:4:4 chroma format.

With the VLD with two-word bit stream segmentation and Huffman transcoding according to the present invention, all chroma formats, including the 4:4:4 chroma format, can be efficiently implemented using the current level of VLSI technology. As shown in FIG. 10, the 4:2:0 chroma format VLD of the present invention can be implemented at the minimal clock rate of 60.24 MHz, the 4:2:2 chroma format VLD of the present invention can be implemented at the minimal clock rate of 76.95 MHz, and the 4:4:4 chroma format VLD of the present invention can be implemented at the minimal clock rate of 110.36 MHz. Some improvements to these numbers can be realized with respect to the parallel processing of motion vectors in the macroblock header.

Although preferred embodiments of the present invention have been described in detail hereinabove, is should be clearly understood that many variations and/or modifications of the basic inventive concepts taught herein which may appear to those skilled in the pertinent art will still fall within the spirit and scope of the present invention, as defined in the appended claims. In this connection, is should be clearly understood that the specific implementation of a pair-match Huffman transcoding method of the present invention described hereinabove is merely illustrative of the many possible implementations of this method.

Further, although the presently preferred embodiment of the VLD 18 has been described in terms of the specific case of two-word bit stream segmentation, it should be appreciated that the present invention broadly encompasses M-word bit stream segmentation, where M $\geq 2$ (e.g., M could be prescribed to be 3 or more), in which case, the Huffman transcoding method of the present invention would have to be adapted to guarantee that any M transcoded symbols could be M-matched for parallel processing without exceeding the bit width of the decoding window of the VLD. Further, as previously mentioned, it should be clearly understood that the Huffman transcoding method of the present invention can be implemented in connection with any suitable parallel VLD architecture in addition to the VLD with M-word bit stream segmentation disclosed herein. It will be appreciated that the pair-match Huffman transcoding method of the present invention is preferably carried out in such a manner that only qualifying code words are Huffman transcoded (i.e., no non-qualifying code words are Huffman transcoded), and that all non-transcoded qualifying code words can either be pair-matched for parallel processing without exceeding the bit width of the decoding window of the VLD, or can be sequentially processed without sacrificing double throughput of the VLD.

What is claimed is:

1. A method for pair-match Huffman transcoding a Huffman-encoded bit stream which includes a plurality of qualifying and non-qualifying types of variable length original code words to be processed by a variable length decoder (VLD) with two-word bit stream segmentation, wherein the VLD has a decoding window N bits wide, and the method includes the steps of:

pair-match Huffman transcoding at least selected ones of the qualifying types of code words to produce corresponding transcoded code words; and, wherein the combined length of any pair of said transcoded code words is $\leq N$, and N is less than the combined length of two maximum length qualifying code words.

2. The method as set forth in claim 1, wherein:

the Huffman-encoded bit stream is an MPEG video bit stream which includes motion vectors, DCT coefficients, including DCT Huffman symbols and DCT coefficient escape sequences having runs of 0, 1, and 2 or more, and setup data; and, the qualifying code words include the motion vectors and DCT coefficients.

3. The method as set forth in claim 2, wherein said at least selected ones of the qualifying types of code words include all DCT coefficient escape sequences having runs of 0 and 1.

4. The method as set forth in claim 3, wherein said at least selected ones of the qualifying types of code words further includes all DCT coefficients having a bit length $\geq 11$.

5. The method as set forth in claim 4, wherein:

the step of pair-match Huffman transcoding is carried out by adding one bit to the end of each of a plurality of the original code words in order to thereby produce respective transcoded code words; and, for each of said transcoded code words, a first logic level of the added bit indicates that the transcoded code word has the same meaning as the respective original code word, and a second logic level of the added bit indicates that the transcoded code word has a different meaning from that of the respective original code word.

6. The method as set forth in claim 4, wherein all of said transcoded code words which represent original DCT coefficients having a bit length $\geq 11$ have the same bit length.

7. The method as set forth in claim 4, wherein the step of determining the combined length is carried out by using a prefix combination table which contains entries corresponding to all possible two-word combinations of the prefixes of the transcoded and non-transcoded code words of the qualifying type.

8. The method as set forth in claim 1, wherein the combined length of any pair of the qualifying types of code words which are not transcoded is $\leq N$, except for qualifying types of code words which can be processed singularly by the VLD in such a manner as to ensure that at least four DCT coefficients are processed during two sequential clock cycles of the VLD.

9. The method as set forth in claim 8, wherein the qualifying types of code words which can be processed singularly by the VLD in such a manner as to ensure that at least four DCT coefficients are processed during two sequential clock cycles of the VLD comprise the DCT coefficient escape sequences having runs of 2 or more.

10. The method as set forth in claim 1, wherein:
the step of pair-match Huffman transcoding is carried out by adding one bit to the end of each of a plurality of the original code words in order to thereby produce respective transcoded code words; and,
for each of said transcoded code words, a first logic level of the added bit indicates that the transcoded code word has the same meaning as the respective original code word, and a second logic level of the added bit indicates that the transcoded code word has a different meaning from that of the respective original code word.

11. The method as set forth in claim 1, wherein:
the Huffman-encoded bit stream is an MPEG video bit stream which includes payload data and setup data;
the qualifying types of code words comprise code word types corresponding to the payload data; and,
the non-qualifying types of code words comprise code word types corresponding to the setup data.

12. A method for processing a Huffman-encoded bit stream which includes a plurality of qualifying and non-qualifying types of variable length original code words, by two-word bit stream segmentation, including the steps of:
pair-match Huffman transcoding at least selected ones of the qualifying types of code words to produce corresponding transcoded code words;
buffering all of the transcoded code words and all of the non-transcoded ones of the variable length original code words, and outputting an input bit stream comprised of both the transcoded and non-transcoded ones of the variable length original code words;
registering the input bit stream and producing a sequence of available input bits;
providing a decoding window N bits wide that includes one or more code words contained in the sequence of available input bits;
determining whether or not the decoding window contains a pair of qualifying code words;
if it is determined that the decoding window contains a pair of qualifying code words, then determining the combined length of the pair of qualifying code words, producing a combined length signal representative of the combined length, and shifting the decoding window across the sequence of available input bits in response to the combined length signal;
determining the length of a leading code word contained in the decoding window, and producing a leading word length signal representative of the determined length of the leading code word;
if it is determined that the decoding window does not contain a pair of qualifying code words, then shifting the decoding window across the sequence of available input bits in response to the leading word length signal; and,
wherein the combined length of any pair of the transcoded code words is $\leq N$, and N is less than the combined length of two maximum length qualifying code words.

13. The method as set forth in claim 12, wherein:
the Huffman-encoded bit stream is an MPEG video bit stream which includes motion vectors, DCT coefficients, including DCT Huffman symbols and DCT coefficient escape sequences having runs of 0, 1, and 2 or more, and setup data; and,
the qualifying code words include the motion vectors and DCT coefficients.

14. The method as set forth in claim 13, wherein the at least selected ones of the qualifying types of code words include all DCT coefficient escape sequences having runs of 0 and 1.

15. The method as set forth in claim 14, wherein the at least selected ones of the qualifying types of code words further includes all DCT coefficients having a bit length $\geq 11$.

16. The method as set forth in claim 15, wherein:
the step of pair-match Huffman transcoding is carried out by adding one bit to the end of each of a plurality of the original code words in order to thereby produce respective transcoded code words; and,
for each of the transcoded code words, a first logic level of the added bit indicates that the transcoded code word has the same meaning as the respective original code word, and a second logic level of the added bit indicates that the transcoded code word has a different meaning from that of the respective original code word.

17. The method as set forth in claim 16, wherein the qualifying types of code words which can be processed singularly in such a manner as to ensure that at least four DCT coefficients are processed during two sequential clock cycles comprise the DCT coefficient escape sequences having runs of 2 or more.

18. The method as set forth in claim 15, wherein all of the transcoded code words which represent original DCT coefficients having a bit length $\geq 11$ have the same bit length.

19. The method as set forth in claim 12, wherein:
the step of pair-match Huffman transcoding is carried out by adding one bit to the end of each of a plurality of the original code words in order to thereby produce respective transcoded code words; and,
for each of the transcoded code words, a first logic level of the added bit indicates that the transcoded code word has the same meaning as the respective original code word, and a second logic level of the added bit indicates that the transcoded code word has a different meaning from that of the respective original code word.

20. The method as set forth in claim 12, wherein the combined length of any pair of the qualifying types of code words which are not transcoded is $\leq N$, except for qualifying types of code words which can be processed singularly in such a manner as to ensure that at least four DCT coefficients are processed during two sequential clock cycles.

21. The method as set forth in claim 12, wherein:
the Huffman-encoded bit stream is an MPEG video bit stream which includes payload data and setup data;

the qualifying types of code words comprise code word types corresponding to the payload data; and, the non-qualifying types of code words comprise code word types corresponding to the setup data.

22. The method as set forth in claim 12, further comprising the step of decoding the values of the one or more code words contained in the decoding window.

23. The method as set forth in claim 12, wherein the variable length original code words each includes a prefix which defines its bit length, wherein code words of the same type and same bit length, but having different values, have the same prefix.

24. A variable length decoder for processing a Huffman-encoded bit stream which includes a plurality of qualifying and non-qualifying types of variable length original code words, by two-word bit stream segmentation, comprising:

means for pair-match Huffman transcoding at least selected ones of the qualifying types of code words to produce corresponding transcoded code words;

means for buffering all of the transcoded code words and all of the non-transcoded ones of the variable length original code words, and outputting an input bit stream comprised of both the transcoded and non-transcoded ones of the variable length original code words;

means for registering the input bit stream and producing a sequence of available input bits;

shifter means for providing a decoding window N bits wide that includes one or more code words contained in the sequence of available input bits;

code word length decoding means for determining whether or not the decoding window contains a pair of qualifying code words, and for determining the combined length of the pair of qualifying code words and producing a combined length signal representative of the determined combined length, if it is determined that the decoding window contains a pair of qualifying code words, and further, for determining the length of a leading code word contained in the decoding window and producing a leading word length signal representative of the determined length of the leading code word;

computation loop means for generating a word pointer signal, in response to either the combined length signal, if it is determined that the decoding window contains a pair of the qualifying code words, or otherwise, in response to the leading word length signal, the shifter means being responsive to the word pointer signal for shifting the decoding window across the sequence of available input bits; and, wherein the combined length of any pair of the transcoded code words is ≦N, and N is less than the combined length of two maximum length qualifying code words.

25. The variable length decoder as set forth in claim 24, further including code word value decoding means for decoding the values of the one or more code words contained in the decoding window.

26. The variable length decoder as set forth in claim 25, further including control means for determining the types of code words currently being decoded based upon previous and current decoding results, and for generating a table select signal indicative of the determined type of the code word(s) currently being decoded.

27. The variable length decoder as set forth in claim 26, wherein the code word length decoding means and the code word value decoding means are each responsive to the table select signal for selecting an appropriate coding table for decoding the length and value of the code word(s) currently being decoded, respectively.

28. The variable length decoder as set forth in claim 25, wherein the code word value decoding means includes:

a first register coupled to the decoding window for registering input bits included within the decoding window and outputting a registered first word window;

a first code word value decoder coupled to the registered first word window for decoding the value of a first code word contained in the decoding window;

a barrel shifter coupled to the registered first word window and outputting a second word window, the barrel shifter having a shift input coupled to the leading word length signal, the barrel shifter being responsive to the leading word length signal for shifting the second word window across a sequence of available bits included within the registered first word window; and, a second code word value decoder coupled to the second word window for decoding the value of a second code word, if any, contained in the decoding window.

29. The variable length decoder as set forth in claim 24, wherein the variable length original code words each includes a prefix which defines its bit length, wherein code words of the same type and same bit length, but having different values, have the same prefix.

30. The variable length decoder as set forth in claim 29, wherein the code word length decoding means includes a prefix combination table for determining the combined length of the pair of qualifying code words contained in the decoding window, and a word length table for determining the length of a leading code word contained in the decoding window.

31. The variable length decoder as set forth in claim 30, wherein the prefix combination table contains entries corresponding to all possible two-word combinations of the prefixes of the code words of the qualifying type.

32. The variable length decoder as set forth in claim 24, wherein the computation loop means includes:

a multiplexer which has a first input for receiving the leading word length signal, a second input for receiving the combined length signal, a control input for receiving a control signal indicative of whether or not the decoding window includes a pair of the qualifying code words, the multiplexer being, responsive to the control signal for outputting either the leading word length signal or the combined length signal; and, adder-accumulator means responsive to either the leading word length signal or the combined length signal, whichever is outputted by the multiplexer, for producing the word pointer signal.

33. The variable length decoder as set forth in claim 30, further including control means for generating the control signal.

34. The variable length decoder as set forth in claim 32, wherein the Huffman-encoded bit stream comprises an MPEG digital video bit stream.

35. The variable length decoder as set forth in claim 24, wherein the code word length decoding means includes a prefix combination table for determining the combined length of N qualifying code words contained in the decoding window, and a word length table for determining the length of a leading code word contained in the decoding window.

36. The variable length decoder as set forth in Claim 35, wherein the prefix combination table contains entries corresponding to all possible combinations of the prefixes of the transcoded and non-transcoded code words of the qualifying type.

37. The variable length decoder as set forth in claim 24, wherein:
the Huffman-encoded bit stream is an MPEG video bit stream which includes payload data and setup data:
the qualifying types of code words comprise code word types corresponding to the payload data; and
the non-qualifying types of code words comprise code word types corresponding to the setup data.

38. A device for pair-match Huffman transcoding a Huffman-encoded bit stream which includes a plurality of qualifying and non-qualifying types of variable length original code words to be processed by a variable length decoder (VLD) with two-word bit stream segmentation, wherein the VLD has a decoding window N bits wide, and the device comprises:
a transcoding circuit for pair-match Huffman transcoding at least selected ones of the qualifying types of code words to produce corresponding transcoded code words; and,
wherein the combined length of any pair of said transcoded code words is $\leq N$, and N is less than the combined length of two maximum length qualifying code words.

39. The device as set forth in claim 38, wherein:
the Huffman-encoded bit stream is an MPEG video bit stream which includes motion vectors, DCT coefficients, including DCT Huffman symbols and DCT coefficient escape sequences having runs of 0, 1, and 2 or more, and setup data; and,
the qualifying code words include the motion vectors and DCT coefficients.

40. The device as set forth in claim 39, wherein said at least selected ones of the qualifying types of code words include all DCT coefficient escape sequences having runs of 0 and 1.

41. The device as set forth in claim 40, wherein said at least selected ones of the qualifying types of code words further includes all DCT coefficients having a bit length $\geq 11$.

42. The device as set forth in claim 41, wherein:
said transcoding circuit achieves pair-match Huffman transcoding by adding one bit to the end of each of a plurality of the original code words in order to thereby produce respective transcoded code words; and,
for each of said transcoded code words, a first logic level of the added bit indicates that the transcoded code word has the same meaning as the respective original code word, and a second logic level of the added bit indicates that the transcoded code word has a different meaning from that of the respective original code word.

43. The device as set forth in claim 42, wherein all of said transcoded code words which represent original DCT coefficients having a bit length $\geq 11$ have the same bit length.

44. The device as set forth in claim 42, wherein the qualifying types of code words which can be processed singularly by the VLD in such a manner as to ensure that at least four DCT coefficients are processed during two sequential clock cycles of the VLD comprises the DCT coefficient escape sequences having runs of 2 or more.

45. The device as set forth in claim 38, wherein:
said transcoding circuit achieves pair-match Huffman transcoding by adding one bit to the end of each of a plurality of the original code words in order to thereby produce respective transcoded code words; and,
for each of said transcoded code words, a first logic level of the added bit indicates that the transcoded code word has the same meaning as the respective original code word, and a second logic level of the added bit indicates that the transcoded code word has a different meaning from that of the respective original code word.

46. The device as set forth in claim 38, wherein the combined length of any pair of the qualifying types of code words which are not transcoded is $\leq N$, except for qualifying types of code words which can be processed singularly by the VLD in such a manner as to ensure that at least four DCT coefficients are processed during two sequential clock cycles of the VLD.

47. The device as set forth in claim 38, wherein:
the Huffman-encoded bit stream is an MPEG video bit stream which includes payload data and setup data;
the qualifying types of code words comprise code word types corresponding to the payload data; and,
the non-qualifying types of code words comprise code word types corresponding to the setup data.

48. A device for Huffman transcoding a Huffman-encoded bit stream which includes a plurality of qualifying and non-qualifying types of variable length original code words to be processed by a variable length decoder (VLD) with M-word bit stream segmentation, wherein the VLD has a decoding window N bits wide, and the device comprises:
a transcoding circuit for pair match Huffman transcoding at least selected ones of the qualifying types of code words to produce corresponding transcoded code words; and
wherein the combined length of any M of said transcoded code words is $\leq N$, wherein $M \geq 2$, and wherein N is less than a combined length of M maximum length qualifying code words.

49. The device as set forth in claim 48, wherein:
the Huffman-encoded bit stream is an MPEG video bit stream which includes motion vectors, DCT coefficients, including DCT Huffman symbols and DCT coefficient escape sequences having runs of 0, 1, and 2 or more, and setup data; and,
the qualifying code words include the motion vectors and DCT coefficients.

50. The device as set forth in claim 49, wherein said at least selected ones of the qualifying types of code words include all DCT coefficient escape sequences having runs of 0 and 1.

51. The device as set forth in claim 50, wherein said at least selected ones of the qualifying types of code words further includes all DCT coefficients having a bit length $\geq 11$.

52. The device as set forth in claim 51, wherein:
said transcoding circuit achieves Huffman transcoding by adding one bit to the end of each of a plurality of the original code words in order to thereby produce respective transcoded code words; and,
for each of said transcoded code words, a first logic level of the added bit indicates that the transcoded code word has the same meaning as the respective original code word and a second logic level of the added bit indicates that the transcoded code word has a different meaning from that of the respective original code word.

53. The device as set forth in claim 52, wherein all of said transcoded code words which represent original DCT coefficients having a bit length $\geq 11$ have the same bit length.

54. The device as set forth in claim 48, wherein:
said transcoding circuit achieves Huffman transcoding by adding one bit to the end of each of a plurality of the original code words in order to thereby produce respective transcoded code words; and, for each of said transcoded code words, a first logic level of the added bit indicates that the transcoded code word has the same meaning as the respective original code word, and a second logic level of the added bit indicates that the transcoded code word has a different meaning from that of the respective original code word.

55. The device as set forth in claim 48, wherein:

the Huffman-encoded bit stream is an MPEG video bit stream which includes payload data and setup data;

the qualifying types of code words comprise code word types corresponding to the payload data; and, the non-qualifying types of code words comprise code word types corresponding to the setup data.

56. A variable length decoder for processing a Huffman-encoded bit stream which includes a plurality of qualifying and non-qualifying types of variable length original code words, by M-word bit stream segmentation, comprising:

means for Huffman transcoding at least selected ones of the qualifying types of code words to produce corresponding transcoded code words;

means for buffering all of the transcoded code words and all of the non-transcoded ones of the variable length original code words, and outputting an input bit stream comprised of both the transcoded and non-transcoded ones of the variable length original code words:

means for registering the input bit stream and producing a sequence of available input bits;

shifter means for providing a decoding window N bits wide that includes one or more code words contained in the sequence of available input bits:

code word length decoding means for determining whether or not the decoding window contains M ones of the qualifying code words, and for determining the combined length of the M ones of the qualifying code words and producing a combined length signal representative of the determined combined length, if it is determined that the decoding window contains M ones of the qualifying code words, and further, for determining the length of M-1 leading code words contained in the decoding window and producing a leading word length signal representative of the determined length of the M-1 leading code words;

computation loop means for generating a word pointer signal, in response to either the combined length signal, if it is determined that the decoding window contains M ones of the qualifying code words, or otherwise, in response to the leading word length signal, the shifter means being responsive to the word pointer signal for shifting the decoding window across the sequence of available input bits; and, wherein the combined length of any M ones of the transcoded code words is $\leq N$, where $M \geq 2$.

* * * * *